(12) United States Patent
Moriwaki et al.

(10) Patent No.: US 6,583,981 B2
(45) Date of Patent: Jun. 24, 2003

(54) CERAMIC CONDENSER MODULE

(75) Inventors: Nobushige Moriwaki, Izumo (JP);
Masahiro Nishio, Izumo (JP);
Kazuhiro Yoshida, Okayama-ken (JP);
Kazuyuki Kubota, Izumo (JP); Shigeki Nishiyama, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/993,566

(22) Filed: Nov. 27, 2001

(65) Prior Publication Data

US 2002/0084091 A1 Jul. 4, 2002

(30) Foreign Application Priority Data

Nov. 29, 2000 (JP) ........................................ 2000-363317

(51) Int. Cl.[7] ................................................. H01G 4/06
(52) U.S. Cl. .............................. 361/321.2; 361/306.1; 361/306.3; 361/303; 361/313; 257/532; 257/535
(58) Field of Search ............................. 361/321.2, 760, 361/738, 761, 763, 306.1, 306.3, 744, 803, 303, 311–313; 257/532, 535, 516, 538

(56) References Cited

U.S. PATENT DOCUMENTS 5,633,783 A * 5/1997 Yamamoto
5,744,863 A * 4/1998 Culnane et al.
5,773,871 A * 6/1998 Boyd et al.
5,973,928 A * 10/1999 Blasi et al.
6,266,226 B1 * 7/2001 Hayashi
6,418,030 B1 * 7/2002 Yamaguchi et al.

FOREIGN PATENT DOCUMENTS

| JP | 10-223473 | 8/1998 |
|----|-----------|--------|
| JP | 10-241989 | 9/1998 |

* cited by examiner

*Primary Examiner*—Dean A. Reichard
*Assistant Examiner*—Nguyen Ha
(74) *Attorney, Agent, or Firm*—Keating & Bennett, LLP

(57) ABSTRACT

A ceramic condenser module includes at least one first multi-layered ceramic condenser and at least one second multi-layered ceramic condenser, which are mounted to a front surface and a back surface of a substrate, respectively. When a total surface area of the outside surfaces of the mounted first and second multi-layered ceramic condensers excluding surfaces thereof opposing the substrate is defined as S2, and a total equal to S2 and a surface area of the outside surface of the substrate excluding the area covered by the first and second multi-layered ceramic condensers is defined as S1, S1 is equal to or greater than about 1.3 times S2. With this arrangement, the ceramic condenser module is suitable for use with large amounts of current, has excellent heat-dissipation effect, is much smaller and much less expensive.

20 Claims, 11 Drawing Sheets

FIG. 16

CERAMIC CONDENSER MODULE

BACKGROUND OF THE INVENTION

1. Field of the Invention

The present invention relates to a ceramic condenser module which is used in circuits which pass a relatively large amount of electrical current and which is used, for example, for smoothing or snubber purposes at, for example, a high-frequency region, and, more particularly, to a ceramic condenser module having an improved heat-dissipation structure.

2. Description of the Related Art

Various ceramic condenser modules having a plurality of multi-layered ceramic condensers connected in parallel as condensers for use with a large amount of electrical current have been proposed. Such types of ceramic condenser modules, disclosed in, for example, Japanese Unexamined Patent Application Publication Nos. 10-241989 and 10-223473, have a plurality of ceramic condensers that are stacked in accordance with the direction of an external electrode in order to form an integral structure. A metallic terminal is joined to this integrally formed structure for achieving electrical connection to an external element.

A single multi-layered ceramic condenser for use with external current is also known.

Multi-layered ceramic condensers for use with a large amount of current generate a relatively large amount of heat. Therefore, it is necessary to efficiently dissipate the heat that is generated therein.

The heat that has been generated by the single multi-layered ceramic condenser mounted onto a substrate is discharged by conduction of heat to the substrate or by convection of heat into the air from an exposed surface of the multi-layered ceramic condenser. In such a structure having a single multi-layered ceramic condenser mounted to a substrate, the natural convection heat transfer coefficient is usually of the order of 0.96. In order to increase the cooling efficiency to a higher value than this, it is necessary to mount, for example, a cooling fin on each condenser.

However, when the single multi-layered ceramic condenser is used, it is directly mounted to a circuit board, so that it is difficult to further increase the heat-dissipation area. In addition, interference with other elements occurs, so that it is difficult to cause the single multi-layered ceramic condenser to contact a cooling member such as a heat sink.

When a conventional ceramic condenser module having a plurality of ceramic condensers that are stacked is used, and is mounted to a circuit board, there are only a heat-dissipation path through which heat is transferred to the substrate through an external electrode and a metallic terminal, and a heat-dissipation path through which heat is discharged by convection of heat from barely exposed side surfaces of the multi-layered ceramic condensers. In other words, since the plurality of ceramic condensers are stacked, heat tends to be confined at the stacked portions of the multi-layered ceramic condensers, so that heat-dissipation efficiency is not satisfactory, thereby resulting in a temperature increase in the ceramic condenser module.

The temperature of a condenser when a load is applied depends upon the heat-dissipation efficiency. Therefore, in a ceramic condenser module having a temperature that tends to reach a high value, it is not possible to make use of the maximum current capacity characteristic of each of the multi-layered ceramic condensers of the condenser module.

When using a large amount of electrical current, in order to increase cooling efficiency, the use of a method using a cooling member, such as a heat sink, may be considered. However, in a conventional ceramic condenser module, the heat sink can easily be in contact with only some of the multi-layered ceramic condensers. Therefore, it is difficult to sufficiently cool the condensers that are located spaced away from the heat sink.

Consequently, in order for a large amount of electrical current to be used in a conventional stacked type ceramic module, it is necessary to increase the capacity by further connecting the plurality of ceramic condenser modules in parallel, thereby increasing the volumes of the condensers and related manufacturing costs.

SUMMARY OF THE INVENTION

In order to overcome the problems described above, preferred embodiments of the present invention provide a ceramic condenser module that has greatly increased heat dissipation efficiency and, thus, provides a desired current capacity, and which has a greatly reduced size.

According to a preferred embodiment of the present invention, a ceramic condenser module includes at least one multi-layered ceramic condenser and a substrate arranged such that the at least one multi-layered ceramic condenser is mounted in close contact therewith, the substrate including a plurality of electrode lands electrically connected to the at least one multi-layered ceramic condenser. In the ceramic condenser module, a total surface area S1, which is equal to the total of the surface areas of the at least one multi-layered ceramic condenser and the substrate, is equal to or greater than about 1.3 times a total surface area S2, which is equal to the total area of an outer surface of the at least one stacked type ceramic mounted to the substrate excluding a surface thereof opposing the substrate.

In a first modification of the first preferred embodiment of the present invention, the at least one multi-layered ceramic condenser is adhered to the substrate preferably via resin containing a metal oxide.

When the structure of the first preferred embodiment or the first modification thereof is used, there may be realized a second modification thereof in which a plurality of multi-layered ceramic condensers are mounted to the substrate without being stacked upon each other, the plurality of multi-layered ceramic condensers being electrically connected in parallel via the plurality of electrode lands.

When any one of the structures of the first preferred embodiment and the first and second modifications thereof is used, there may be realized a third modification in which the plurality of multi-layered ceramic condensers are mounted to a front surface and a back surface of the substrate.

When any one of the structures of the first preferred embodiment and the first, second and third modifications thereof is used, there may be realized a fourth modification in which the at least one multi-layered ceramic condenser or the plurality of multi-layered ceramic condensers and the substrate are electrically connected using a metallic terminal.

When any one of the structures of the first preferred embodiment and the first through fourth modifications thereof is used, there may be realized a fifth modification in which the substrate includes a terminal electrode for electrical connection to an external portion, a through hole for securing the ceramic condenser module with a screw or bolt, or other suitable fastening element, being disposed in a portion where the terminal electrode is provided.

When any one of the structures of the first preferred embodiment and the first through fifth modifications thereof is used, there may be realized a sixth modification in which the substrate includes a terminal electrode for electrical connection to an external element, and a metallic terminal is joined to the terminal electrode.

When any one of the structures of the first preferred embodiment and the first through sixth modifications thereof is used, there may be realized a seventh modification in which a through hole electrode for electrically connecting an electrode on each of the front surface and the back surface of the substrate is disposed in the substrate.

According to another preferred embodiment of the present invention, a power converter includes at least one ceramic condenser module constructed according to any one of the first preferred embodiment and the first through seventh modifications thereof.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

The features, characteristics and advantages of the present invention will be made apparent by the following description of preferred embodiments of the present invention with reference to the drawings.

Figure 1A:
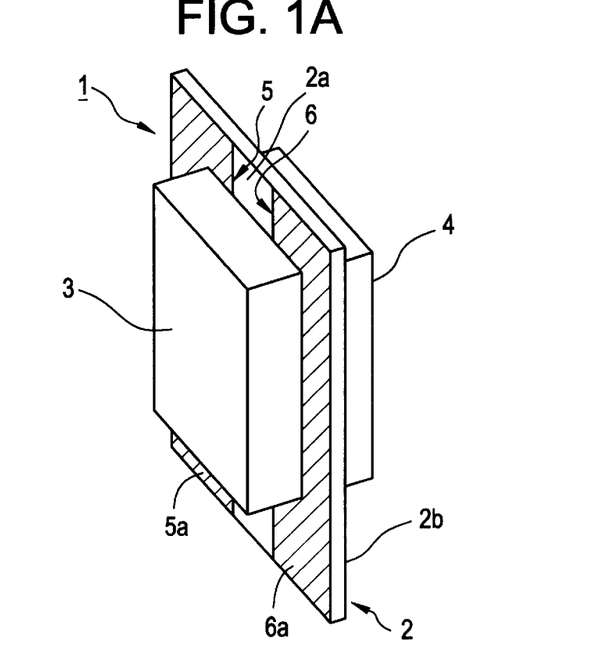
FIG. 1A is a perspective view of a ceramic condenser module of a first preferred embodiment of the present invention.
Figure 1B:
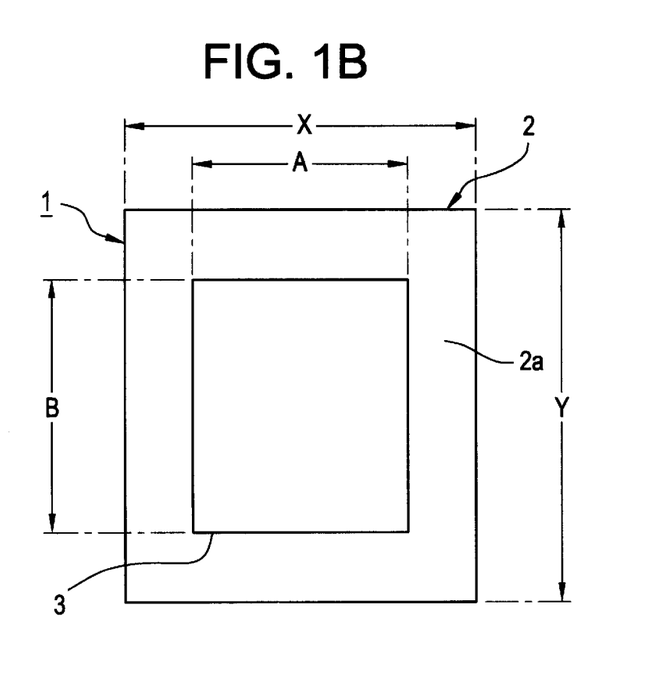
FIG. 1B is a schematic side view thereof as seen from a side of one of the surfaces of a substrate.

FIG. 1A is a perspective view of a ceramic condenser module of a first preferred embodiment of the present invention, and FIG. 1B is a side view thereof as seen from a side of one of the surfaces of a substrate.

A ceramic condenser module 1 includes a substrate 2 and a plurality of multi-layered ceramic condensers 3 and 4.

Although the material used to form the substrate 2 is not particularly limited, it is preferable to use a material having a good heat-dissipation effect. It is more preferable to use a substrate having a better heat-dissipation effect than a glass epoxy substrate conventionally used for this purpose. When importance is attached to heat-dissipation effect in this manner, substrates made of, for example, a metal, such as aluminum, or alumina are preferably used. When a substrate made of a metal is used, the surfaces are covered with an insulating covering layer, and an electrode land or other suitable element is disposed on the insulating covering layer. When importance is attached to thermal shock resistance or other such properties, it is preferable to use a ceramic substrate formed of, for example, alumina, or other suitable material. When a glass epoxy resin substrate, a synthetic resin substrate, or a substrate made of synthetic resin composite material is used, the cost of the substrate 2 can be reduced.

The heat-dissipation effect of the entire substrate 2 can be increased by increasing the width and area of the electrode on the substrate 2 in addition to carefully selecting the material used to form the substrate 2. Such a substrate having a heat-dissipation effect that has been improved by carefully selecting the electrode structure in this manner is also included in the class of substrates having good heat-dissipation effect.

Strip-like electrode lands 5 and 6 are disposed on a front surface 2a of the substrate 2 along side edges so as to oppose each other. Although not shown in FIG. 1A, a similar pair of electrode lands are also disposed on a back surface 2b of the substrate 2.

The electrode lands 5 and 6 are formed by a suitable method such as a thin-film forming method or conductive paste baking, or other suitable method.

A portion near one of the ends of each of the electrode lands 5 and 6 defines a terminal electrode 5a and a terminal electrode 6a for electrical connection with an external element, respectively.

The schematically shown multi-layered ceramic condensers 3 and 4 are mounted in close contact with the front surface 2a and the back surface 2b of the substrate 2. The multi-layered ceramic condenser 3 is electrically connected to the electrode lands 5 and 6. More specifically, by soldering or by using electrically conductive adhesive, one of the external electrodes of the multi-layered ceramic condenser 3 is electrically connected and is secured to the electrode land 5, and the other external electrode thereof is connected and is secured to the electrode land 6. Similarly, the multi-layered ceramic condenser 4 is electrically connected and is secured to the electrode lands on the back surface of the substrate 2. The electrode lands 5 and 6 on the front surface of the substrate 2 and the electrode lands on the back surface of the substrate 2 are electrically connected by an electrode (not shown) at the bottom surface of the substrate 2, whereby the multi-layered ceramic condensers 3 and 4 are connected in parallel. The electrode lands on the front and back surfaces of the substrate 2 may also be connected by a through hole electrode.

The multi-layered ceramic condensers 3 and 4 may have metallic terminals that are joined to the external electrodes thereof. In this case, the metallic terminals are joined to the electrode lands 5 and 6 by, for example, soldering, or other suitable joining method or element.

The multi-layered ceramic condensers 3 and 4 may have lead terminals. In this case, through holes for inserting the lead terminals are formed in the electrode lands 5 and 6. The lead terminals are inserted into the corresponding through holes in order to electrically connect the lead terminals and the electrode lands 5 and 6 by, for example, soldering, or other suitable joining method or element. In this case, in order to electrically insulate the lead terminals and the electrode lands on the back surface 2b from each other, missing portions around the lead terminals are formed in the electrode lands on the back surface 2b. In this case, the multi-layered ceramic condensers 3 and 4 are adhered to the substrate 2 through resin having a good heat-dissipation effect. Resins having good heat-dissipation effects are not particularly limited, but are preferably epoxy resins or the like, and, more preferably, insulating metallic oxides such as aluminum oxides, or other suitable materials. These types of resins may be used to further increase the heat-dissipation effect.

In this way, the structure for mounting the multi-layered ceramic condensers 3 and 4 to the substrate 2 is not particularly limited.

A feature of the present preferred embodiment is that, when a total surface area of outer surfaces of the multi-layered ceramic condensers 3 and 4 mounted to the substrate 2 excluding the surfaces thereof opposing the substrate 2 is represented by S2 and a total equal to S2 and the areas of outer surfaces of the substrate 2 excluding the portions thereof covered by the multi-layered ceramic condensers 3 and 4 is represented by S1, S1 is at least about 1.3 times S2.

In this preferred embodiment, more specifically, the substrate 2 preferably has a substantially square form having a side which has a length X of, for example, approximately 8 mm and has a thickness of, for example, approximately 1 mm.

In the present preferred embodiment, since a horizontal dimension A, a height-direction dimension B, and thickness of each of the multi-layered ceramic condensers 3 and 4 are preferably about 6 mm, about 5 mm, and about 3.5 mm, respectively, the approximate total surface area S2 of the multi-layered ceramic condensers 3 and 4 is 6×5×2+(6+5)×2×3.5×2=214 mm$^2$.

Therefore, S1=214+(8×8−6×5)×2+8×1×4=314.

In the ceramic condenser module 1, as mentioned above, S1 is equal to or greater than about 1.3 times S2, so that, by natural convection of heat, heat is effectively dissipated from the multi-layered ceramic condensers 3 and 4. In particular, since the multi-layered ceramic condensers 3 and 4 are mounted to the front surface 2a and the back surface 2b of the substrate 2, respectively, heat is efficiently dissipated from the individual ceramic condensers 3 and 4 through a heat-dissipation path by natural convection of heat and a path of heat conduction to the substrate 2. Therefore, compared to a conventional ceramic condenser module, the natural convection heat transfer coefficient is approximately doubled. When S1 is made equal to or greater than about 1.3 times S2, the heat dissipation effect is considerably increased. This will be described in more detail below based on specific experimental examples.

In the ceramic condenser module 1 of the present preferred embodiment, since the multi-layered ceramic condensers 3 and 4 are mounted to the front surface 2a and the back surface 2b of the substrate 2, respectively, the substrate 2 can be mounted in a standing state to, for example, a circuit board, as shown in FIG. 1A. Therefore, it is possible to cause a cooling member, such as a heat sink, to easily contact the multi-layered ceramic condensers 3 and 4, so that cooling efficiency can be increased even more.

Since the heat-dissipation effect is increased, ESR can be made correspondingly large, so that the volume of each of the condensers 3 and 4 can be made small. When multi-layered ceramic condensers having the same volume (capacitance characteristics) are used, the cooling efficiency can be correspondingly increased, so that the temperature increase of each of the multi-layered ceramic condensers can be restricted, thereby making it possible to increase capacity of current that is made to flow in each of the multi-layered ceramic condensers 3 and 4.

Figure 2A:
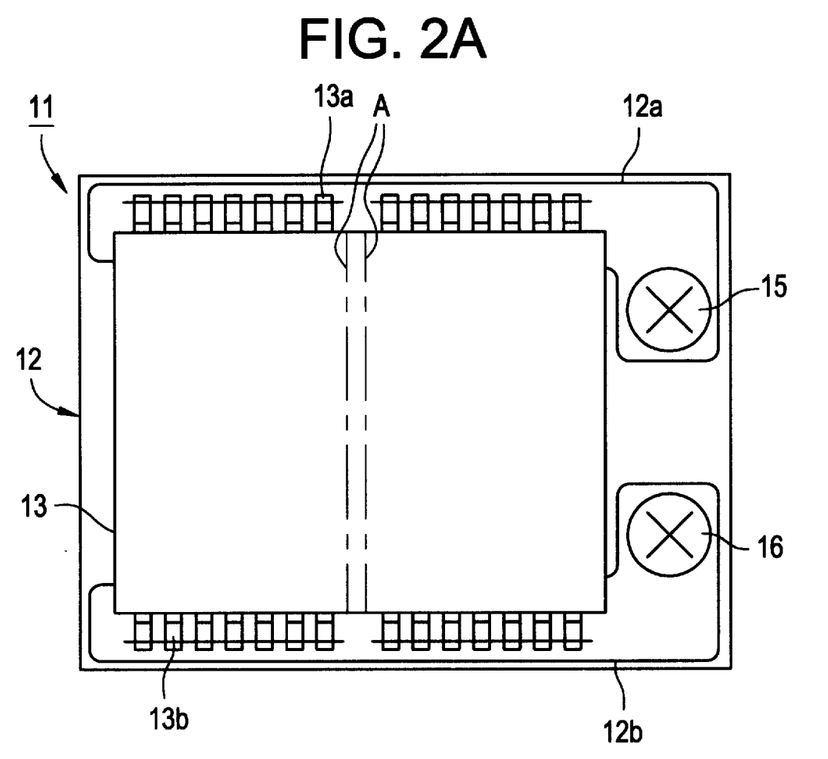
FIGS. 2A and 2B are a plan view and a front view of a ceramic condenser module of a second preferred embodiment of the present invention, respectively.
Figure 2B:
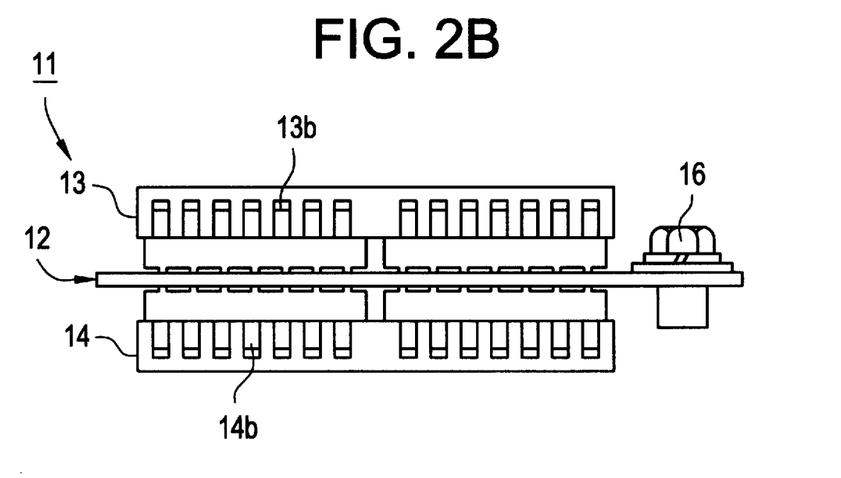

FIGS. 2A and 2B are a plan view and a front view of a second preferred embodiment of a ceramic condenser module of the present invention, respectively.

In a ceramic condenser module 11, multi-layered ceramic condensers 13 and 14 are mounted to the top surface and the bottom surface of a substantially rectangular, plate-shaped substrate 12, respectively. More specifically, as in the first preferred embodiment, the multi-layered ceramic condensers 13 and 14 are adhered and mounted to both sides of the substrate 12 through resin having a good heat-dissipation effect.

In this preferred embodiment, the multi-layered ceramic condensers 13 and 14 are also electrically connected in parallel.

Figure 3:
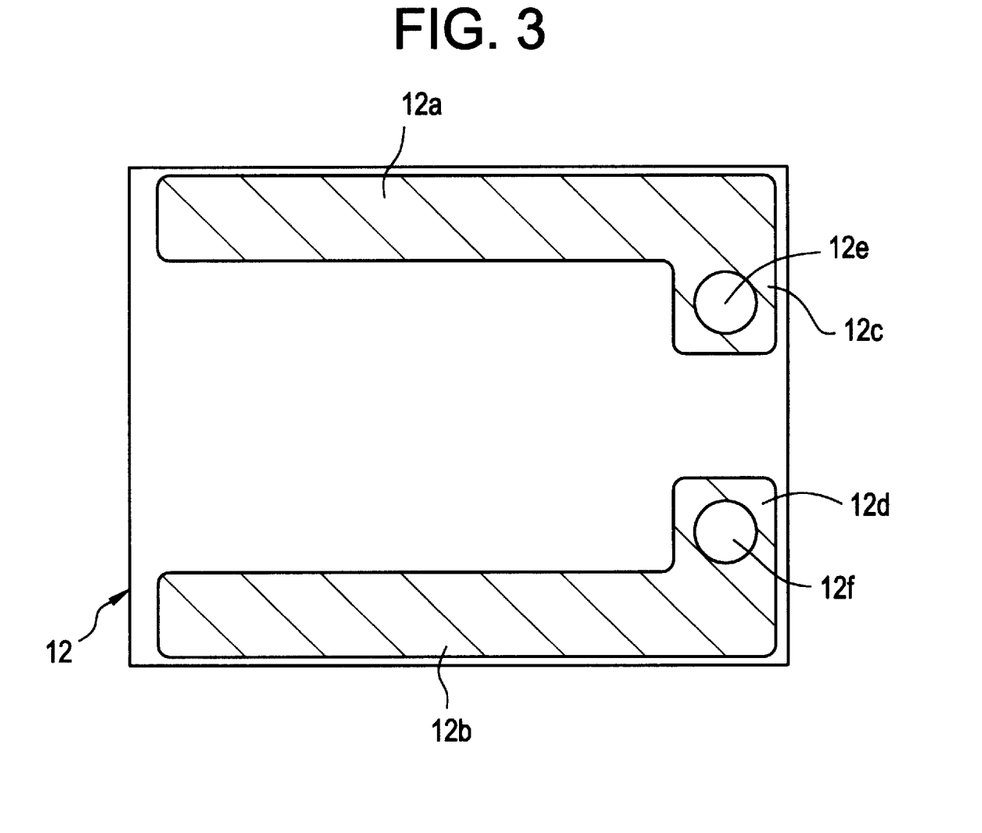
FIG. 3 is a plan view of a substrate used in the second preferred embodiment of the present invention.

As shown in plan view in FIG. 3, electrode lands 12a and 12b are disposed on the top surface of the substrate 12 along a pair of longer sides of the substrate 12. One end portion of each of the electrode lands 12a and 12b is bent inwardly at one end portion of the substrate 12 so that the one end portion of each of the electrode lands 12a and 12b is substantially perpendicular to its body, thereby defining terminal electrodes 12c and 12d, respectively. Through holes 12e and 12f are formed in the terminal electrodes 12c and 12d, respectively.

The through holes 12e and 12f are arranged to fasten the ceramic condenser module 11 to, for example, an external circuit board or a terminal table using screws 15 and 16 shown in FIGS. 2A and 2B. More specifically, using the screws 15 and 16, the terminal electrodes 12c and 12d are electrically connected to, for example, an external circuit board, so that the ceramic condenser module 11 is mechanically secured to the circuit board or the terminal table.

The multi-layered ceramic condenser 13 includes metallic terminals 13a and metallic terminals 13b, and the multi-layered ceramic condenser 14 includes metallic terminals 14b. Ends of the terminals 13a, the terminals 13b and the terminals 14b are divided into a plurality of thin-piece lead portions.

Taking the multi-layered ceramic condenser 13 as an example, the terminals 13a and the terminals 13b extend downward from corresponding sides of the multi-layered ceramic condenser 13, and are inwardly bent so as to be substantially parallel to the bottom surface of the body of the multi-layered ceramic condenser 13. Accordingly, since the inwardly bent portions of the lead portions at the ends of the terminals 13a and 13b extend substantially parallel to the electrode lands 12a and 12b, they are stably and reliably secured to the electrode lands 12a and 12b using solder, for example. In this way, the terminals 13a and 13b of the multi-layered ceramic condenser 13 are electrically connected and mechanically secured to the electrode lands 12a and 12b, respectively.

Similarly, the multi-layered ceramic condenser 14 is mounted to the bottom surface of the substrate 12. Therefore, the terminals 13a connected to one potential of the multi-layered ceramic condenser 13 and the terminals connected to an equal potential of the multi-layered ceramic condenser 14 are electrically connected by the screw 15. The terminals 13b connected to the other potential of the multi-layered ceramic condenser 13 and the terminals 14b connected to the other potential of the multi-layered ceramic condenser 14 are electrically connected by the screw 16. Consequently, using the electrode lands 12a and 12b, the plurality of multi-layered ceramic condensers 13 and 14 are electrically connected in parallel.

In the ceramic condenser module 11 of the embodiment, a short side, a long side, and thickness of the substrate 12 are about 40.6 mm, about 53 mm, and about 1 mm, respectively.

Since a short side, a long side, and thickness of the top surface of the body of each of the ceramic condensers 13 and 14, stacked upon the substrate 12, are about 32 mm, about 40 mm, and about 4.5 mm, respectively, the total surface area S2 is 32×40×2+(32+40)×4.5×2=3208 mm². S1=S2+ (40.6×56.2−32×40)×2+(40.6+53)×2×1=5398.64 mm. In other words, even in the second preferred embodiment, S1 is equal to or greater than about 1.3 times S2.

Therefore, as in the first preferred embodiment, even in the ceramic condenser module 11 of the second preferred embodiment, compared to a conventional ceramic condenser module, heat of the multi-layered ceramic condensers 13 and 14 can be effectively dissipated. In addition, even in the second preferred embodiment, the multi-layered ceramic condensers 13 and 14 are separately mounted to both surfaces of the substrate 12, so that a cooling member, such as a heat sink, can easily be made to contact the multi-layered ceramic condensers 13 and 14.

The ceramic condenser module 11 is mounted to an external circuit board or a terminal table using the screws 15 and 16, so that a portion of the substrate 11 is in contact with the external circuit board or a terminal table. Therefore, the heat transfer paths become large as a result of increased contact area, so that, compared to the case where multi-layered ceramic condensers are soldered to, for example, a printed circuit board, it is possible to further increase heat-dissipation efficiency.

Figure 4:
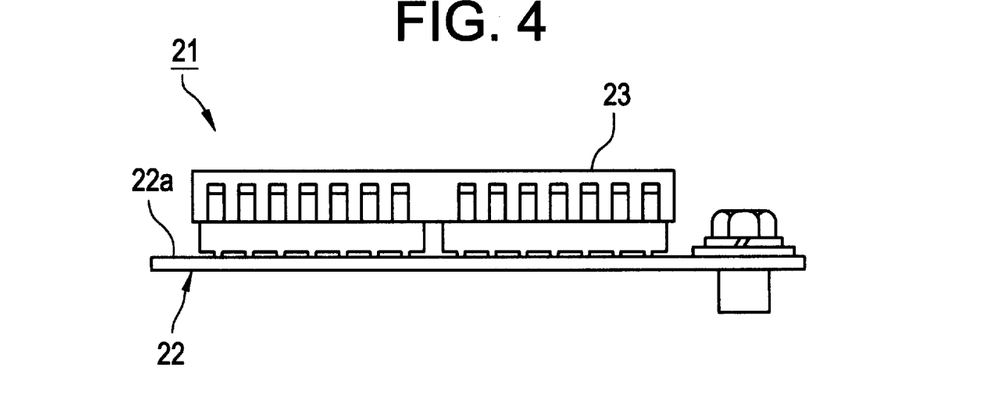
FIG. 4 illustrates a surface of a modification of the ceramic condenser module of the second preferred embodiment of the present invention.

FIG. 4 is a front view used to illustrate a modification of the second preferred embodiment of the present invention. In a ceramic condenser module 21 shown in FIG. 4, a multi-layered ceramic condenser 23 is secured to only a top surface 22a of a substrate 22. The other features are the same as those of the stacked type condenser module 11 of the second preferred embodiment.

In the present preferred embodiment, as in the ceramic condenser module 21, the multi-layered ceramic condenser 23 may be mounted to only the top surface 22a, that is, one surface of the substrate 22. Even in this case, when a total surface area S1, which is defined as described above, is made equal to or greater than about 1.3 times a total surface area S2, which corresponds to the total area of the outer surface of the multi-layered ceramic condenser 23 in a mounted state excluding the surface thereof opposing the substrate 22, it is possible to increase heat-dissipation efficiency as in the first and second preferred embodiments.

Even in the second preferred embodiment, since the top surface and the side surfaces of the multi-layered ceramic condenser 23 are exposed, it is possible to increase heat-dissipation efficiency compared to a conventional ceramic condenser module in which a plurality of ceramic condensers are stacked.

In the multi-layered ceramic condensers 1, 11, and 21 of the corresponding first preferred embodiment, second preferred embodiment, and modifications of the second preferred embodiment, the stacked-type ceramic condensers 3, 13, and 23 are singly mounted to one side of the corresponding substrates 2, 12, and 22. However, a plurality of such multi-layered ceramic condensers may be disposed in a row on one surface of each of its corresponding substrates 2, 12, and 22. For example, the stacked-type ceramic condenser 13 used in the second preferred embodiment may be divided into two stacked-type ceramic condensers at an alternate long and short dashed line A—A shown in FIG. 2A.

In other words, in any one of the ceramic condenser modules of various preferred embodiments of the present invention, a plurality of multi-layered ceramic condensers may be provided side by side on at least one of the surfaces of the substrate. By electrically connecting the plurality of multi-layered ceramic condensers in parallel, it is possible to obtain an even larger current capacity.

The fact that, when S1 is equal to or greater than about 1.3 times S2, the heat-dissipation effect is considerably increased in any one of the ceramic condenser modules of the present invention will be explained based on specific experimental examples.

The ceramic condenser module 21 shown in FIG. 4 was constructed into a ceramic condenser module having five multi-layered ceramic condensers 23 provided side by side on one of the surfaces of the substrate 22 so that they were disposed close together in parallel and which had a rated DC voltage of 250 V. In the ceramic condenser module, a direct-current bias voltage of 200 V was applied, and a sinusoidal current of about 10 kHz was passed at a rate of 1 Arms/$\mu$F in order to measure temperature in a steady state. In this case, the surface area of a portion of each of the five stacked type condensers excluding the surface thereof mounted to the substrate 22 was about 1928 mm². Therefore, a total surface area S2 of the five multi-layered ceramic condensers excluding the mounting surfaces thereof was about 9640 mm². One of the surfaces of the substrate 22 to which the stacked type condensers were mounted was varied, so that S1 was also varied in order to carry out the experiment. The results are shown in FIG. 15.

Figure 15:
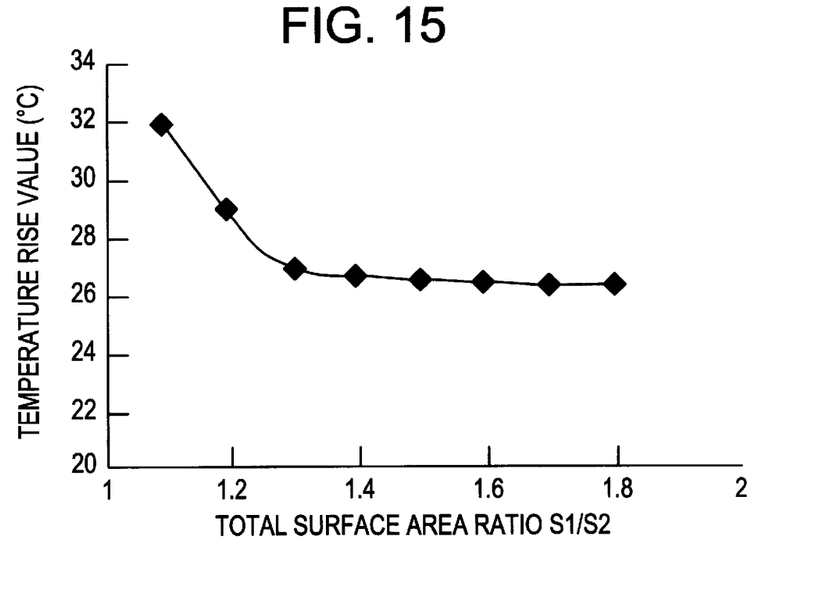
FIG. 15 is a graph showing the relationship between temperature increase value and total surface area ratio S1/S2 in a ceramic condenser module of various preferred embodiments of the present invention.

As is clear from FIG. 15, it was discovered that, in the steady state, when S1 was less than about 1.3, the temperature increase was greater than about 27° C., whereas, when S1 was equal to or greater than about 1.3 times S2, the temperature increase was approximately equal to or less than 27° C. and became substantially constant. Therefore, it was discovered that, in the present invention, the total surface area S1 should be equal to or greater than about 1.3 times S2.

Next, in the ceramic condenser module 21 shown in FIG. 4, one to eight multi-layered ceramic condensers to be mounted to the substrate 22 were used. Even in this case, each of the ceramic condenser modules was arranged so that S1 was equal to or greater than about 1.3 times S2. As in the case where the results shown in FIG. 15 were obtained, the used stacked type condensers had a rated voltage value of DC 250 V. As in the previous experimental example, in measuring the temperature rise values, a direct-current bias voltage of 250 V was applied, and a sinusoidal current of 10 kHz was made to flow at a rate of 1 Arms/$\mu$F.

For comparison purposes, a conventional ceramic condenser module was produced by placing the stacked type condensers used in the experiment on an approximately 50 mm by 50 mm substrate, and the temperature increase values thereof were similarly measured. The results are shown in FIG. 16.

Figure 16:
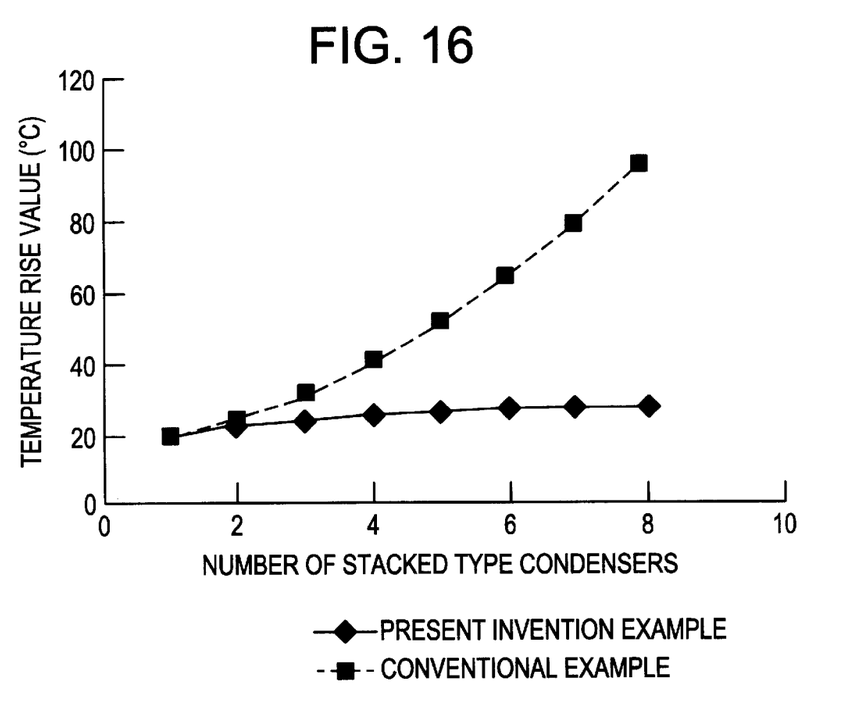
FIG. 16 is a graph showing the relationship between the number of ceramic condensers and temperature increase value in a ceramic condenser module of the experiment and a conventional ceramic condenser module.

In FIG. 16, the solid line represents the results for the case where the ceramic condenser module of various preferred embodiments of the present invention was used, and the broken line represents the results for the case where the conventional ceramic condenser module was used.

As is clear from FIG. 16, it was found that, in the conventional ceramic condenser module, as the number of stacked type condensers increased, the temperature increase value increased. On the other hand, in the stacked type condenser module of the example of the present invention, it was found that, even if the number of stacked type condensers increased, the temperature increase was very small because of the preferred ratio between S1 and S2 constant.

An example of a structure for joining with a cooling member will be described taking the ceramic condenser module 21 shown in FIG. 4 as an example, with reference to FIGS. 5 to 7.

Figure 5:
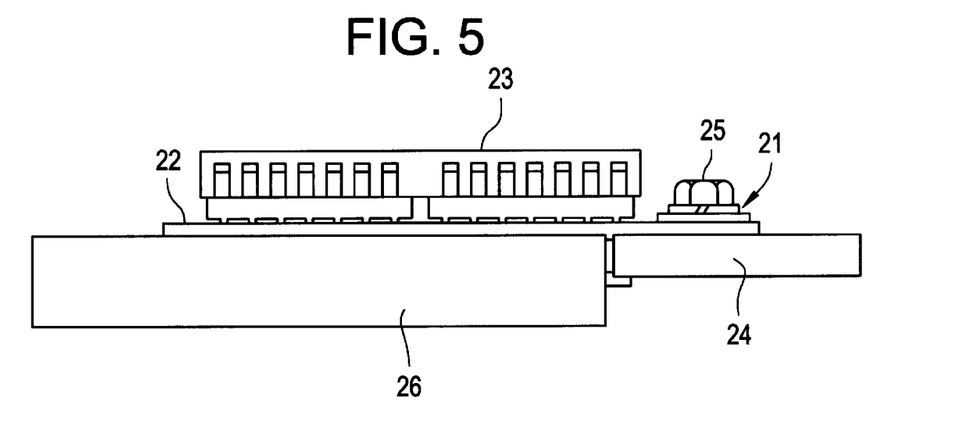
FIG. 5 illustrates a surface of an example of a structure for joining the ceramic condenser module of the second preferred embodiment of the present invention and a heat sink.

As shown in FIG. 5, when the substrate 22 of the ceramic condenser module 21 is secured to a bus bar 24, used for electrical connection to an external portion, using the screw 25, it is possible to cool the multi-layered ceramic condenser 23 from the bottom surface of the substrate 22 by securing a heat sink 26, defining a cooling member, to the bottom surface of the substrate 22.

Figure 6:
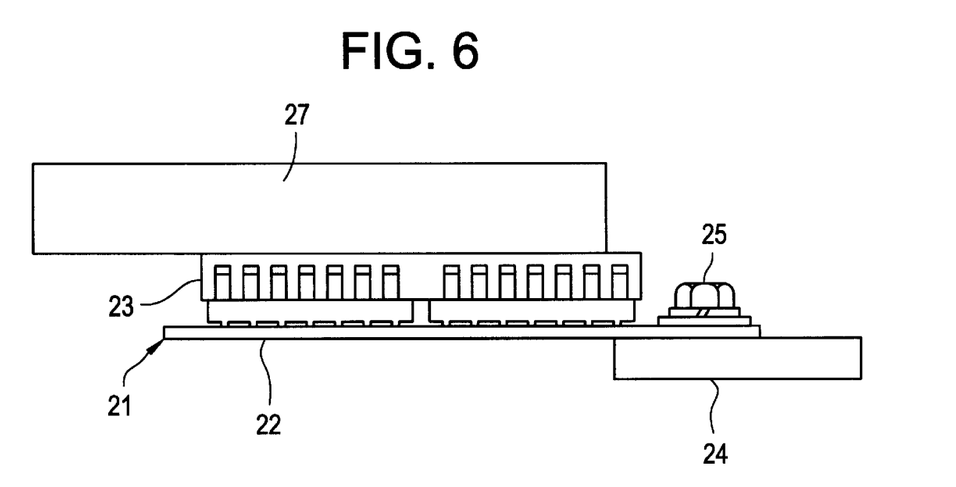
FIG. 6 illustrates a surface of another example of a structure for joining the ceramic condenser module of the second preferred embodiment of the present invention and heat sinks.
Figure 7:
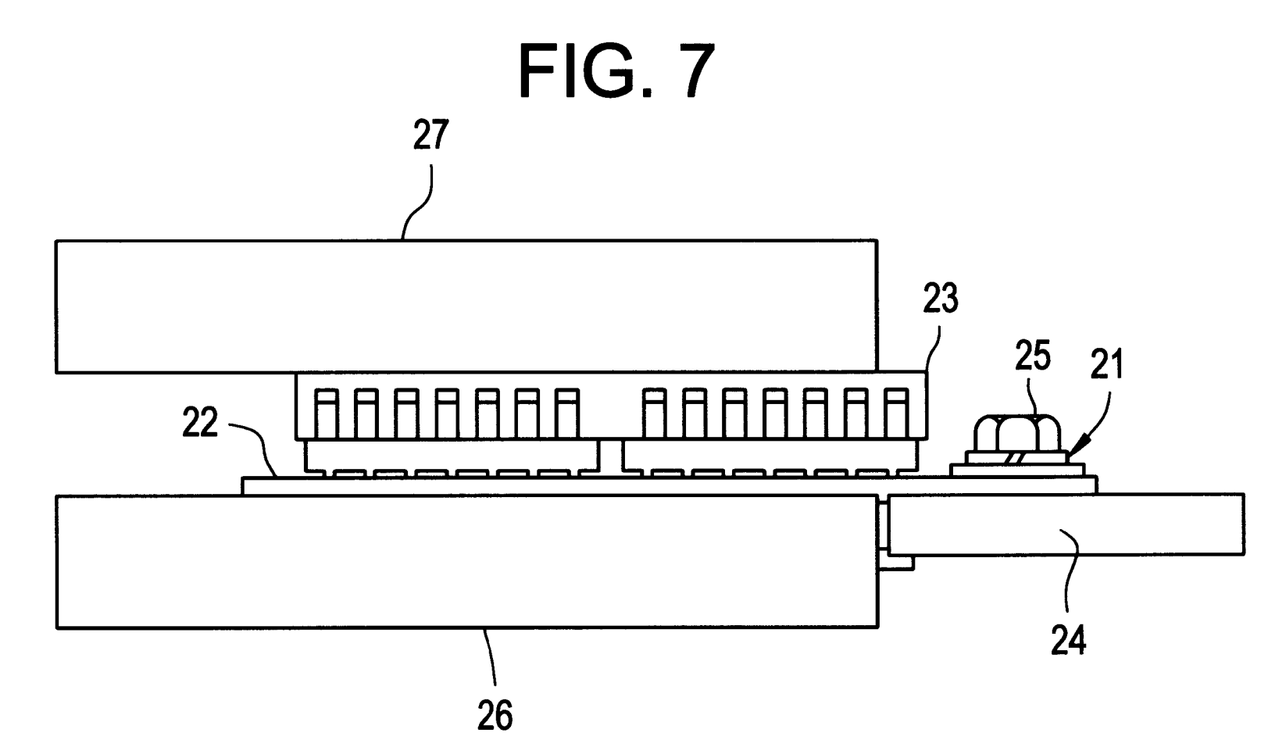
FIG. 7 illustrates a surface of still another example of a structure for joining the ceramic condenser module of the second preferred embodiment of the present invention and the heat sinks.

In addition, as shown in FIG. 6, the multi-layered ceramic condenser 23 may be cooled from the top surface side of the multi-layered ceramic condenser 23 by causing a heat sink 27, defining a cooling member, to contact and to be secured to the top surface of the multi-layered ceramic condenser 23. Further, as shown in FIG. 7, the multi-layered ceramic condenser 23 may be cooled by causing the heat sinks 26 and 27 to contact both the bottom surface of the substrate 22 and the top surface of the multi-layered ceramic condenser 23, respectively. In this way, using various methods, a cooling member can be brought directly into contact with the multi-layered ceramic condenser mounted to the substrate. Therefore, it is possible to further increase heat-dissipation efficiency of the multi-layered ceramic condenser 23.

In the ceramic condenser modules 1 and 11 of the first and second preferred embodiments, the surfaces of the multi-layered ceramic condensers 3 and 4 and 13 and 14 opposite to the sides mounted to the corresponding substrates and the side surfaces thereof are exposed, thereby making it possible to cause a cooling member, such as a heat sink, to directly contact them.

Figure 8A:
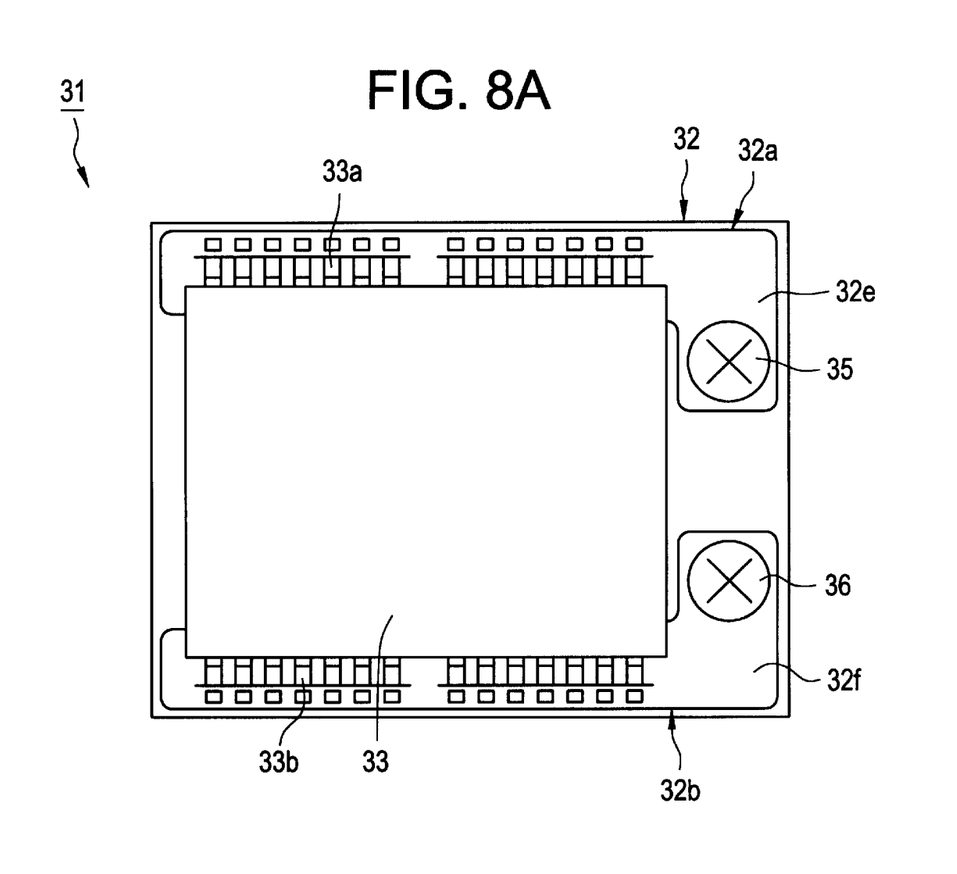
FIGS. 8A and 8B are a plan view and a front view of a ceramic condenser module of a third preferred embodiment of the present invention, respectively.
Figure 8B:
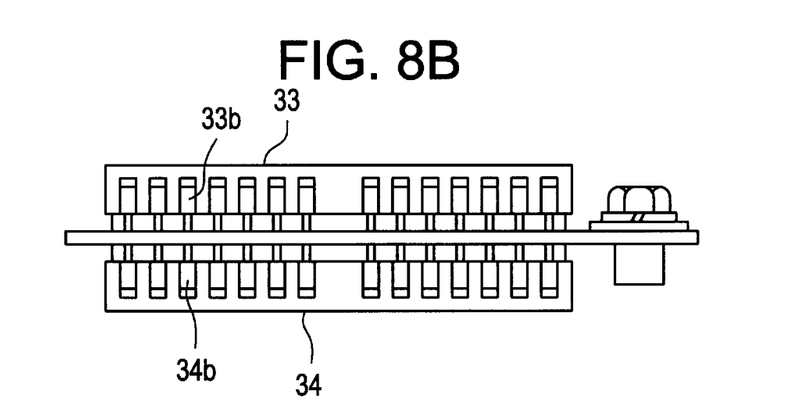

FIGS. 8A and 8B are a plan view and a front view used to describe a third preferred embodiment of a ceramic condenser module in accordance with the present invention, and correspond to FIGS. 2A and 2B that illustrate the second preferred embodiment of the present invention. In a ceramic condenser module 31 of the third preferred embodiment, multi-layered ceramic condensers 33 and 34 are mounted to the top and bottom surfaces of a substrate 32, respectively. The third preferred embodiment differs from the second preferred embodiment in that the multi-layered ceramic condenser 33 includes a plurality of lead terminals 33a and 33b and that the multi-layered ceramic condenser 34 includes a plurality of lead terminals 34b, with the lead terminals extending towards the substrate 32. In the multi-layered ceramic condenser 34, although only the plurality of lead terminals 34b at one side thereof are shown, lead terminals at the other side are similarly formed.

Figure 9:
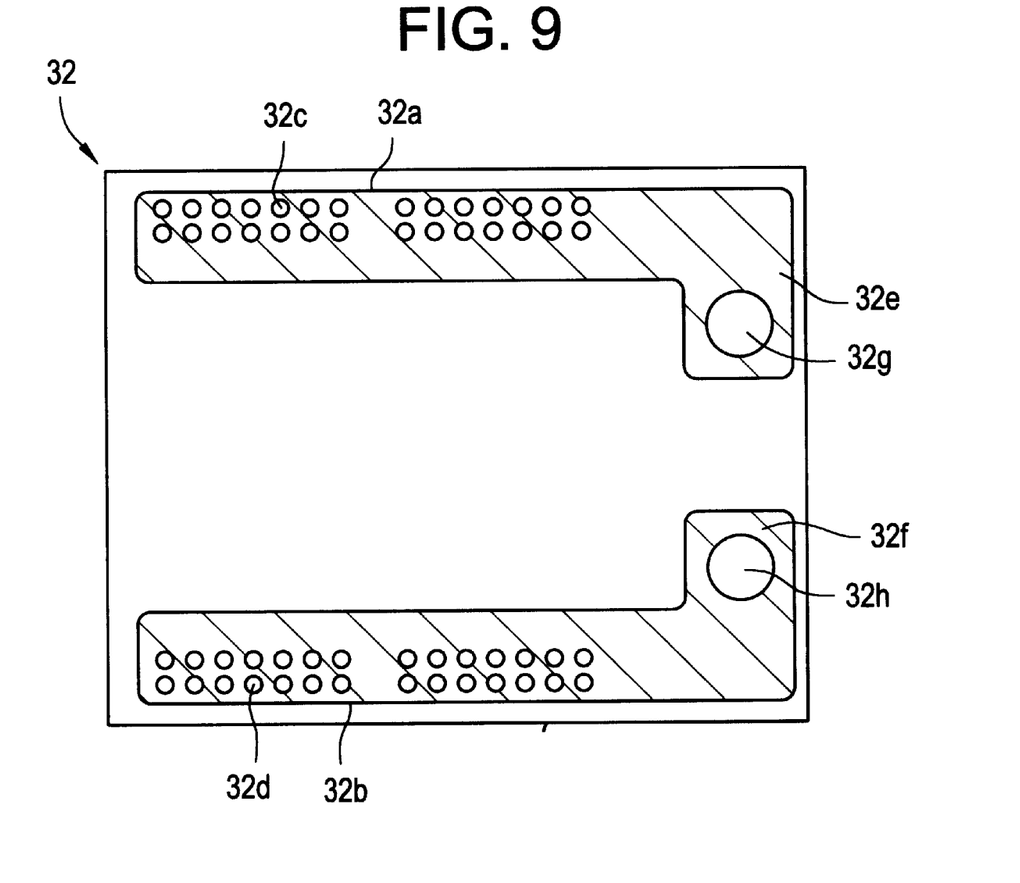
FIG. 9 is a plan view of a substrate used in the third preferred embodiment of the present invention.

As shown in plan view in FIG. 9, a plurality of through holes 32c and holes 32d are formed in portions of the substrate 32 where electrode lands 32a and 32b are located. The lead terminals 33a and the lead terminals 33b are inserted into the corresponding through holes 32c and through holes 32d, and joined thereto by soldering or other suitable joining methods or elements. Similarly, the lead terminals 34b of the multi-layered ceramic condenser 34 at the bottom surface of the substrate 32 are inserted into the remaining through holes 32c and through holes 32d, and are electrically connected to the electrode lands 32a and 32b by soldering. The other structural features are preferably the same as those of the second preferred embodiment.

Therefore, even in the ceramic condenser module 31 of the present preferred embodiment, S1 is equal to or greater than about 1.3 times S2, so that heat of the multi-layered ceramic condensers can be effectively dissipated. As in the second preferred embodiment, cooling efficiency can be increased by causing a cooling member, such as a heat sink, to directly contact the top surfaces of the multi-layered ceramic condensers 33 and 34.

In addition, by securing the ceramic condenser module 32 to an external circuit board or a metallic terminal table using screws 35 and 36 as a result of making use of through holes 32g and 32h provided in corresponding terminals 32e and 32f, it is possible to further increase heat-dissipation effect.

Figure 10A:
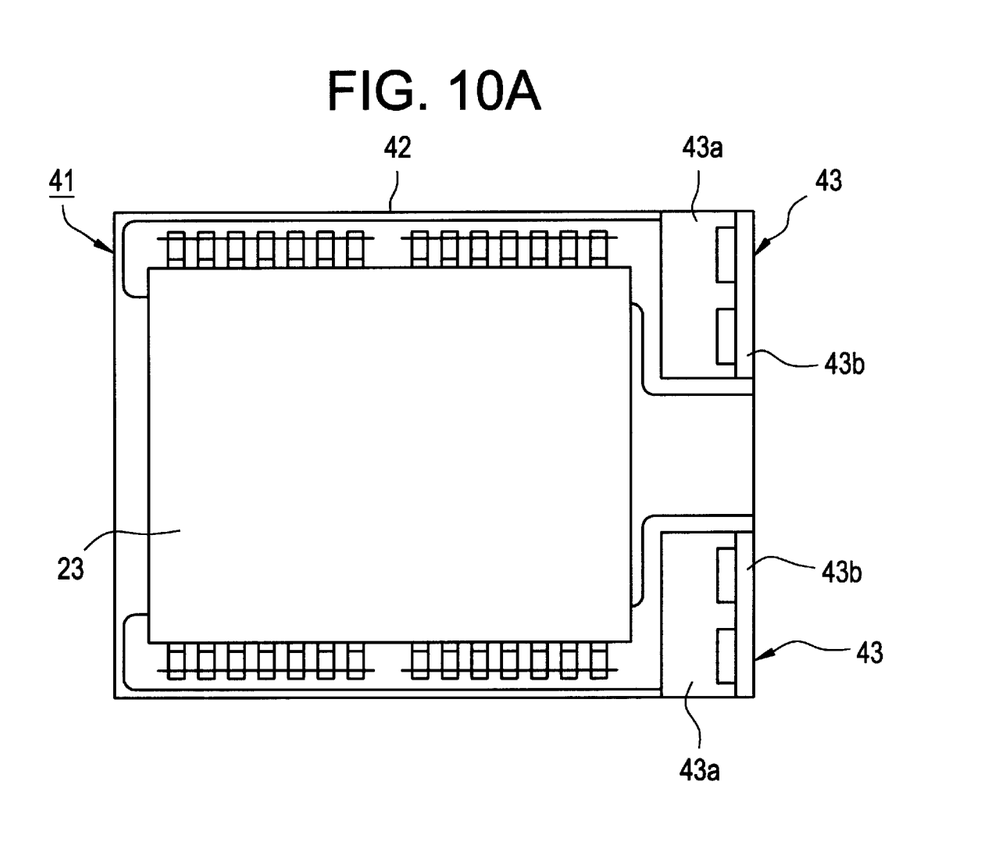
FIGS. 10A and 10B are a plan view and a front view of still another modification of the ceramic condenser module of the second preferred embodiment of the present invention.
Figure 10B:
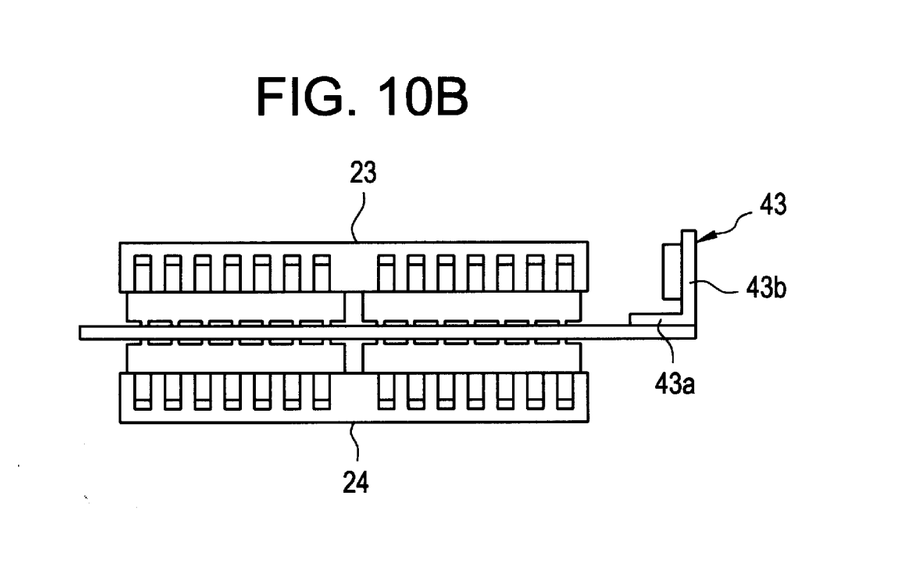

FIGS. 10A and 10B are a plan view and a front view of another modification of the ceramic condenser module 11 of the second preferred embodiment of the present invention. In a ceramic condenser module 41 shown in FIG. 10, metallic terminals 43 and 43 are joined at one end of a substrate 42. Using solder or other suitable joining methods or elements, the metallic terminals 43 and 43 are joined so as to be electrically connected to terminal electrodes 22c and 22d disposed consecutively with electrode lands 22a and 22b. Since the other structural features are preferably the same as those of the second preferred embodiment, corresponding parts will be given the same reference numerals and will not be described below.

The metallic terminals 43 and 43 each include a portion 43a mounted to the terminal electrodes 22c and 22d of the substrate 22 and a portion 43b that extends in a direction that is substantially perpendicular to the corresponding portion 43a. A through hole through which a screw or other joining member passes in a substantially parallel manner is disposed in each portion 43b that extends in a direction that is substantially perpendicular to the substrate 22, so that, using these through holes, screws or bolts are tightened to secure them to an external terminal table or a circuit board.

In the ceramic condenser module 41, since the metallic terminals 43 having the corresponding portions 43b that extend in a direction that is substantially perpendicular to the substrate 42 are provided, the ceramic condenser module 41 can be secured while it is oriented as shown in FIG. 10B using, for example, a threaded hole provided in another member that extends in the vertical direction in FIG. 10B. In addition, the ceramic condenser module 41 may be mounted to the top surface of a printed circuit board so that the direction of extension of the metallic terminals 43 is set in a horizontal direction and so that the substrate 42 is provided in a standing manner.

In this modification of the second preferred embodiment, since the metallic terminals 43 are preferably made of metal, heat transmitted from the multi-layered ceramic condensers 23 and 24 escapes to the portions to which the metallic terminals 43 are mounted via the electrode lands 22a and 22b and the metallic terminals 43. Therefore, the heat is efficiently dissipated using the metallic terminals 43 having certain thicknesses.

As is clear from the ceramic condenser module 41 of this modification of preferred embodiments of the present invention, the ceramic condenser module of the present invention may have metallic terminals joined to the substrate. As shown in FIG. 10B, in the ceramic condenser module 41, the metallic terminals 43 are described as being substantially L-shaped members defined by the portions 43a that are mounted to the substrate 42 and the portions 43b that extend in a substantially perpendicular direction relative to the substrate 42 because they are mounted to the substrate 42, the metallic terminals may have flat plate-shaped configurations.

The stacked type condenser modules of various preferred embodiments of the present invention may be used as condensers for use with large amounts of electrical current, so that they may be suitably used as, for example, smoothing condensers in a power converter using, for example, an insulated gate bipolar transistor (IGBT). Application examples in which ceramic condenser modules of various preferred embodiments of the present invention are used in such power converters of such a type will be given with reference to FIGS. 11 to 14.

Figure 11:
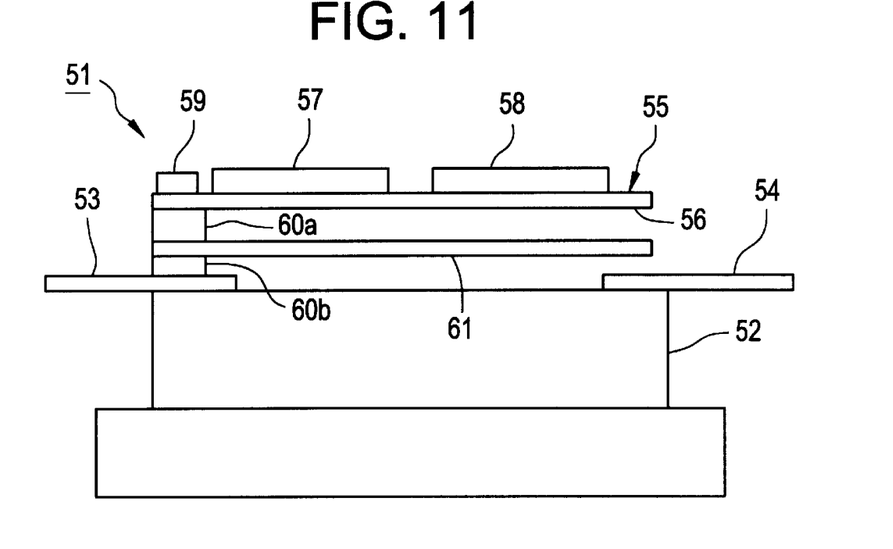
FIG. 11 is an initial front view of a first example of a power converter using a ceramic condenser module of various preferred embodiments of the present invention.

A power converter 51 shown in FIG. 11 preferably includes a power converter body 52, an input terminal 53, and an output terminal 54. The power converter body 52 is constructed using, for example, a suitable inverter, and what is used to construct the power converter body 52 is not particularly limited. The power converter body 52 handles a large amount of current. Therefore, the condensers used as smoothing condensers in this power converter body 52 should have high current capacity.

In the power converter 51, a ceramic condenser module 55 that has been constructed in accordance with preferred embodiments of the present invention is mounted onto an input terminal 53 preferably made of metal. The ceramic condenser module 55 is constructed in substantially the same way as the ceramic condenser module 21 shown in FIG. 4. Here, two multi-layered ceramic condensers 57 and 58 are arranged in side by side on the top surface of a substrate 56. The multi-layered ceramic condensers 57 and 58, schematically shown in FIG. 11, are mounted in the same way as the multi-layered ceramic condenser 23 shown in FIG. 4.

The ceramic condenser module 55 is secured to the power converter body 52 by a screw 59. More specifically, a threaded hole (not shown) is formed in the input terminal 53, and the screw 59 is inserted into the threaded hole. Spacers 60a and 60b are inserted onto the outer side of the screw 59. A control substrate 59 is disposed between the spacers 60a and 60b. A through hole for inserting the screw 59 therethrough is also formed in the control substrate 59. Therefore, by tightening the screw 59, the ceramic condenser module 55 is secured to the input terminal 53 through the spacers 60a and 60b and the control substrate 59. Here, the spacers 60a and 60b are preferably made of metals having excellent heat conductivity. Therefore, heat generated at the multi-layered ceramic condensers 57 and 58 is effectively dissipated to the input terminal 53 side through the screw 59 and the spacers 60a and 60b.

The stacked type ceramic module 55 is constructed in accordance with various preferred embodiments of the present invention. Since S1 is greater than about 1.3 times S2, as in each of the above-described preferred embodiments and modifications thereof, heat is efficiently dissipated by natural convection of heat from the multi-layered ceramic condensers 57 and 58.

The power converter body 52 is secured to a heat sink 61.

Figure 12:
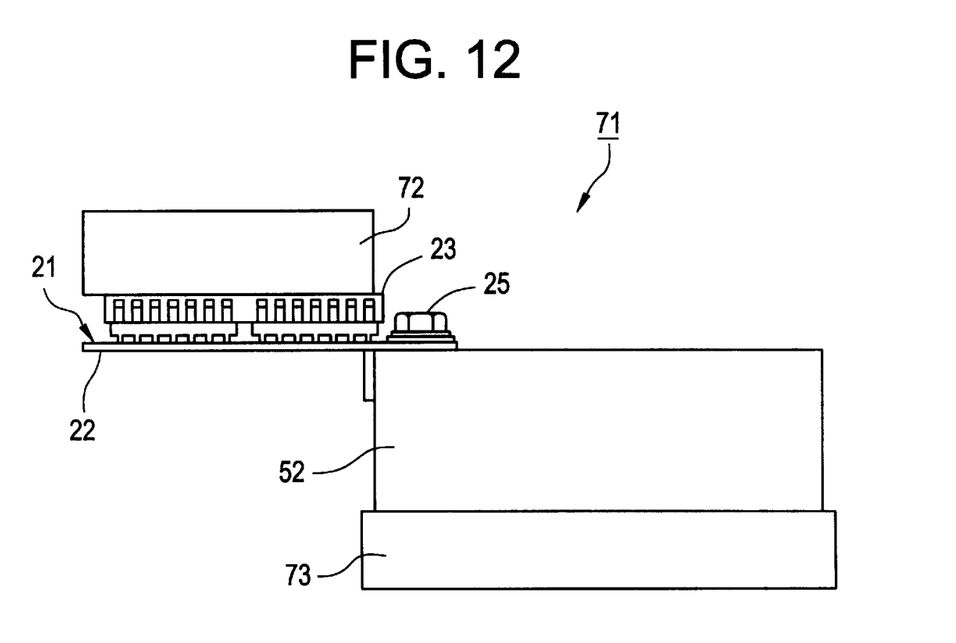
FIG. 12 is a schematic front view of a second example of a power converter using a ceramic condenser module of various preferred embodiments of the present invention.
Figure 13:
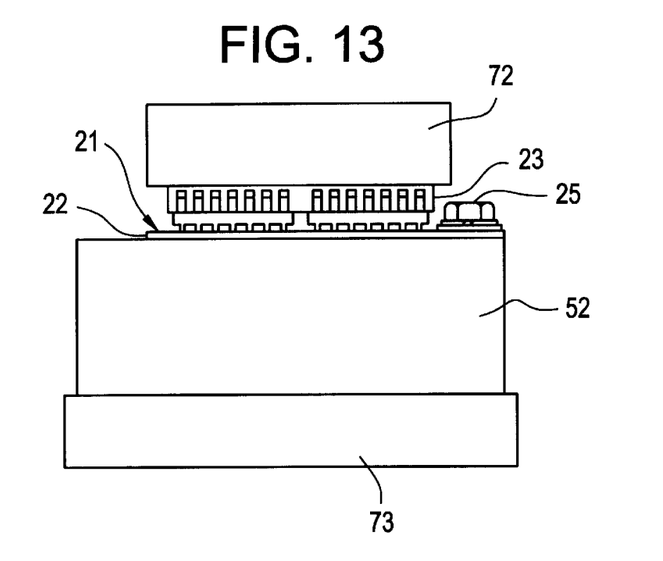
FIG. 13 is a schematic front view of a modification of the power converter shown in FIG. 12.

FIG. 12 is a schematic plan view of another example of a power converter in which a ceramic condenser module of various preferred embodiments of the present invention is used. In a power converter 71, the ceramic condenser module 21 shown in FIG. 4 is used as it is. Here, using the screw 25, the ceramic condenser module 21 is directly secured to the top surface of a power converter body 52. A heat sink 72 is in contact with the top of the multi-layered ceramic condenser 23 of the ceramic condenser module 21. On the other hand, a heat sink 73 is disposed at the bottom surface of the power converter body 52. Therefore, even if the multi-layered ceramic condensers 23 and 24 of the ceramic condenser module 21 generate heat, the heat sink 72 in direct contact therewith effectively cools them. The generated heat is dissipated by natural convection of heat, and is transmitted to the power converter body 52 through the screw 25. The heated power converter body 52 is cooled by the heat sink 73.

In the power converter 71 shown in FIG. 12, the main portion of the ceramic condenser module 21 is mounted to the power converter body 52 so as to be disposed at the outer side of the power converter body 52. As in a modification shown in FIG. 13, the ceramic condenser module 21 may be mounted to the power converter 52 so that the entire surface of the substrate 22 of the ceramic condenser module 21 is disposed on the power converter 52.

Figure 14:
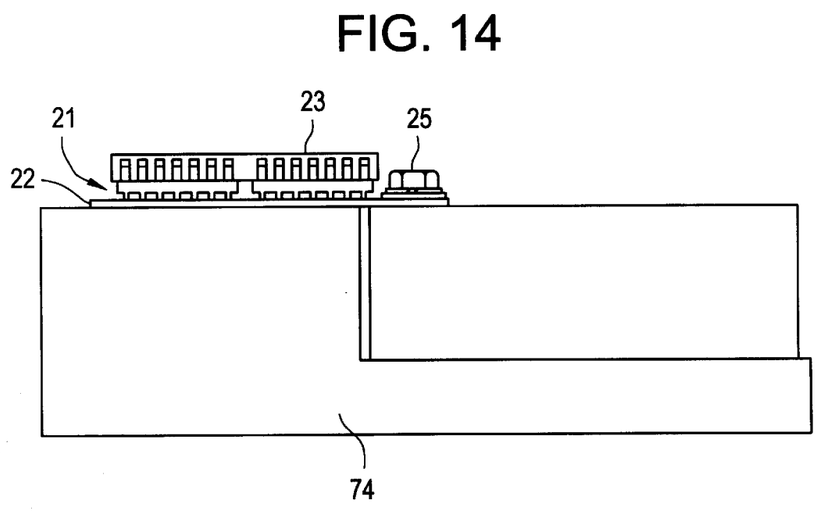
FIG. 14 is a schematic front view of a third example of a power converter using a ceramic condenser module of various preferred embodiments of the present invention.

FIG. 14 is a schematic front view showing still another example of a power converter to which a ceramic condenser module of various preferred embodiments of the present invention is mounted. Here, as in the power converter 71 shown in FIG. 12, the ceramic condenser module 21 is mounted to the power converter body 52. Instead of the heat sink 73, a heat sink 74 having a substantially L shape as viewed from the front is used. The heat sink 74 not only contacts the bottom surface of the power converter 52, but also contacts the bottom surface of the substrate 22 of the ceramic condenser module 21 through its protruding portion that protrudes upward at a side of the power converter body 52.

Based on experiments carried out by the inventor of the invention as claimed in the application concerned, it was confirmed that the volumes of the condensers in the power converter shown in FIG. 11 could be made smaller than the volumes of those used in a conventional ceramic condenser module of the same capacity. In addition, it was confirmed that the volumes of the stacked-type condensers of the power converters shown in FIGS. 12 and 14 could be reduced to less than about 39% of the volumes of those used in corresponding conventional ceramic condenser modules. Therefore, in the structures shown in FIGS. 12 and 14, the volumes of the multi-layered ceramic condensers could be made smaller than the volumes of those used in the ceramic condenser module used in the power converter shown in FIG. 11.

As is clear from each of the power converters shown in FIGS. 11 to 14, when the ceramic condenser modules of various preferred embodiments of the present invention are used as smoothing condensers in the corresponding power converters, the structures for joining to the power converter bodies and the structures for joining to the heat sink or heat sinks may be changed as required.

In the ceramic condenser modules of preferred embodiments of the present invention, at least one multi-layered ceramic condenser is mounted onto the substrate, and the total surface area S1, which is equal to the surface area or areas of the number of ceramic condensers used and the substrate at a fixed quantity, is equal to or greater than about 1.3 times the total surface area S2, which is equal to the area of the surface or surfaces of the multi-layered ceramic condenser or the multi-layered ceramic condensers, mounted to the substrate, excluding the surface or surfaces mounted to the substrate. Therefore, heat generated by the multi-layered ceramic condenser or the multi-layered ceramic condensers can be effectively dissipated not only by conduction of heat to the substrate side but also by natural convection of heat. Consequently, when a multi-layered ceramic condenser or multi-layered ceramic condensers used with large amounts of current is/are used, temperature increases can be prevented, so that current capacity can be ensured, and the number of multi-layered ceramic condensers used can be reduced. In addition, the size and cost of the ceramic condenser module or the ceramic condenser modules can be greatly reduced.

Accordingly, when any one of the ceramic condenser modules of preferred embodiments of the present invention is used as a smoothing condenser of a power converter, such as an inverter, it is possible to achieve much better and greater effects.

When any one of the above-described multi-layered ceramic condensers is adhered to a substrate using resin, the adhesion strength is greatly increased. When resin containing metal oxides is used, the heat-dissipation effect is also significantly increased.

When a plurality of multi-layered ceramic condensers are mounted to a substrate, the plurality of multi-layered ceramic condensers are electrically connected in parallel, so that current capacity is increased even more.

When the plurality of multi-layered ceramic condensers are mounted to the front and back surfaces of the substrate, heat dissipation can be further increased by natural convection of heat from the multi-layered ceramic condensers, and a cooling member, such as a heat sink, can be arranged to directly contact the multi-layered ceramic condensers, at the front surface side and the back surface side of the substrate. Therefore, it is possible to increase cooling efficiency by the cooling member, such as a heat sink.

When the substrate and the stacked type condensers are electrically connected by metallic terminals, the heat dissipation effect can also be increased by the terminals.

When terminal electrodes for electrically connecting the substrate to an external portion are provided, and when the substrate is constructed to be securable to an external portion using screws or bolts on the terminal electrodes, the substrate is brought into close contact with, for example, an external terminal by the securing operation. Therefore, a path for transmitting heat from the terminal electrodes to, for example, an external terminal table can be ensured. Consequently, it is possible to further increase the heat-dissipation effect.

When metallic terminals are joined to the terminal electrodes on the substrate, heat is dissipated to an external terminal table or a circuit board through the metallic terminals, so that the heat-dissipation effect is further increased.

When a through hole electrodes for electrically connecting the front and back surfaces of the substrate are formed, the outer peripheral portion of the substrate does not need a structure for electrically connecting the back surface of the substrate. Therefore, the substrate can be much smaller. When a plurality of multi-layered ceramic condensers are mounted to the front and back surfaces, the multi-layered ceramic condensers on both sides can be easily electrically connected in parallel.

While preferred embodiments of the present invention have been described above, variations thereto will occur to those skilled in the art within the scope of the present inventive concepts, which are delineated by the following claims.

What is claimed is:

1. A ceramic condenser module comprising:
   at least one multi-layered ceramic condenser; and
   a substrate arranged such that the at least one multi-layered ceramic condenser is mounted in close contact therewith, the substrate including a plurality of electrode lands electrically connected to the at least one multi-layered ceramic condenser;
   wherein when a total of an area of an outside surface of the at least one multi-layered ceramic condenser mounted to the substrate excluding a surface thereof opposing the substrate is defined as total surface area S2, and a total equal to the total surface area S2 and a surface area of a portion of the substrate not covered by the at least one multi-layered ceramic condenser is defined as total surface area S1, S1 is equal to or greater than about 1.3 times S2.

2. A ceramic condenser module according to claim 1, further comprising a resin containing metal oxide arranged such that the at least one multi-layered ceramic condenser is adhered to the substrate through the resin containing a metal oxide.

3. A ceramic condenser module according to claim 1, wherein a plurality of multi-layered ceramic condensers are mounted to the substrate without being stacked upon each other, the plurality of multi-layered ceramic condensers being electrically connected in parallel via the plurality of electrode lands.

4. A ceramic condenser module according to claim 1, wherein the substrate includes a front surface and a back surface and the plurality of multi-layered ceramic condensers are mounted to a front surface and a back surface of the substrate.

5. A ceramic condenser module according to claim 1, further comprising a metallic terminal, wherein the at least one multi-layered ceramic condenser and the substrate are electrically connected via the metallic terminal.

6. A ceramic condenser module according to claim 1, wherein the substrate includes a terminal electrode for electrical connection to an external element, a through hole for securing the substrate to another member and being formed in a portion of the substrate where the terminal electrode is provided.

7. A ceramic condenser module according to claim 1, wherein the substrate includes a terminal electrode for electrical connection to an external element, and a metallic terminal which is joined to the terminal electrode for electrical connection to the external element.

8. A ceramic condenser module according to claim 1, wherein the substrate includes a front surface and a back surface, and a through hole electrode is formed in the substrate and arranged to electrically connect the front surface and the back surface of the substrate.

9. A ceramic condenser module according to claim 1, further comprising at least two of the multi-layered ceramic condensers disposed on the substrate and electrically connected in parallel.

10. A ceramic condenser module according to claim 1, wherein the substrate has a substantially square shape having a side that has a length of approximately 8 mm and has a thickness of approximately 1 mm, and the at least one multi-layered ceramic condenser has approximate dimensions of 6 mm by 5 mm by 3.5 mm.

11. A power converter comprising:
   an input terminal;
   an output terminal; and
   a power converter body having at least one multi-layered ceramic condenser including:
      at least one multi-layered ceramic condenser; and
      a substrate arranged such that the at least one multi-layered ceramic condenser is mounted in close contact therewith, the substrate including a plurality of electrode lands electrically connected to the at least one multi-layered ceramic condenser;
      wherein when a total of an area of an outside surface of the at least one multi-layered ceramic condenser mounted to the substrate excluding a surface thereof opposing the substrate is defined as total surface area S2, and a total equal to the total surface area S2 and a surface area of a portion of the substrate not covered by the at least one multi-layered ceramic condenser is defined as total surface area S1, S1 is equal to or greater than about 1.3 times S2.

12. A power converter according to claim 11, further comprising a resin containing metal oxide arranged such that the at least one multi-layered ceramic condenser is adhered to the substrate through the resin containing a metal oxide.

13. A power converter according to claim 11, wherein a plurality of multi-layered ceramic condensers are mounted to the substrate without being stacked upon each other, the plurality of multi-layered ceramic condensers being electrically connected in parallel via the plurality of electrode lands.

14. A power converter according to claim 11, wherein the substrate includes a front surface and a back surface and the plurality of multi-layered ceramic condensers are mounted to a front surface and a back surface of the substrate.

15. A power converter according to claim 11, further comprising a metallic terminal, wherein the at least one multi-layered ceramic condenser and the substrate are electrically connected via the metallic terminal.

16. A power converter according to claim 11, wherein the substrate includes a terminal electrode for electrical connection to an external element, a through hole for securing the substrate to another member and being formed in a portion of the substrate where the terminal electrode is provided.

17. A power converter according to claim 11, wherein the substrate includes a terminal electrode for electrical connection to an external element, and a metallic terminal which is joined to the terminal electrode for electrical connection to the external element.

18. A power converter according to claim 11, wherein the substrate includes a front surface and a back surface, and a through hole electrode is formed in the substrate and arranged to electrically connect the front surface and the back surface of the substrate.

19. A power converter according to claim 11, further comprising at least two of the multi-layered ceramic condensers disposed on the substrate and electrically connected in parallel.

20. A power converter according to claim 11, wherein the substrate has a substantially square shape having a side that has a length of approximately 8 mm and has a thickness of approximately 1 mm, and the at least one multi-layered ceramic condenser has approximate dimensions of 6 mm by 5 mm by 3.5 mm.

* * * * *